United States Patent
Mukai et al.

(10) Patent No.: US 6,511,924 B2
(45) Date of Patent: Jan. 28, 2003

(54) METHOD OF FORMING A SILICON OXIDE LAYER ON A SUBSTRATE

(75) Inventors: Kevin Mukai, Santa Clara, CA (US); Srinivas Nemani, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/839,337

(22) Filed: Apr. 20, 2001

(65) Prior Publication Data

US 2002/0155730 A1 Oct. 24, 2002

(51) Int. Cl.$^7$ .................. H01L 21/31; H01L 21/469
(52) U.S. Cl. .................. 438/787; 438/778; 438/788; 438/789; 438/790
(58) Field of Search ................ 438/787, 788, 438/789, 790, 778

(56) References Cited

U.S. PATENT DOCUMENTS

| | | | |
|---|---|---|---|
| 5,316,639 A | 5/1994 | Okazaki et al. | 204/192.12 |
| 5,665,635 A | 9/1997 | Kwon et al. | 438/427 |
| 5,726,090 A | 3/1998 | Jang et al. | 438/435 |
| 5,869,394 A | 2/1999 | Chen et al. | 438/624 |
| RE36,623 E | 3/2000 | Wang et al. | 427/579 |
| 6,043,136 A | 3/2000 | Jang et al. | 438/424 |
| 6,090,675 A | 7/2000 | Lee et al. | 438/301 |
| 6,107,214 A | 8/2000 | Iyer | 438/787 |
| 6,121,164 A * | 9/2000 | Yieh et al. | 438/790 |
| 6,149,987 A | 11/2000 | Perng et al. | 427/579 |
| 6,180,490 B1 | 1/2001 | Vassiliev et al. | 438/424 |
| 6,180,507 B1 * | 1/2001 | Lan | 438/618 |
| 6,197,705 B1 | 3/2001 | Vassliev | 438/789 |
| 6,245,691 B1 * | 6/2001 | Jang et al. | 438/787 |
| 2002/0000644 A1 * | 1/2002 | Jeon et al. | 257/650 |

FOREIGN PATENT DOCUMENTS

| | | |
|---|---|---|
| WO | WO 90/15018 | 12/1990 |

OTHER PUBLICATIONS

Okuyama et al. "Gas–Phase Nucleation in the Tetraethylorthosilicate (TEOS)/O$_3$ APCVD Process" Ceramics Processing, vol. 43, No. 11A, pp. 2688–2698, 1997.

Shareef et al. "Role of Gas Phase Reactions in Subatmospheric Chemical–Vapor Deposition Ozone–TEOS Processes for Oxide Deposition" J. Vac. Sci. Technol. B 14(2), pp. 772–774, Mar./Apr. 1996.

Adachi et al. "Particle Generation and Film Formation in an Atmospheric–Pressure Chemical Vapour Deposition Process Using Tetraerthylorthosilicate" Journal of Materials Science, vol. 30, pp. 932–937, 1995.

Dobkin et al. "Mechanisms of Deposition of SiO$_2$ from TEOS and Related Organosilicon Compounds and Ozone" J. Electrochem. Soc., vol. 142, No. 7, pp. 2332–2340, Jul. 1995.

Noguchi et al. "Liquid Phase Oxidation Employing O Atoms Produced by Microwave Discharge and Si(CH$_3$)$_4$" Extended Abstracts of the 19th Conference on Solid State Devices and Materials, Tokyo, pp. 451–454, 1987.

(List continued on next page.)

*Primary Examiner*—Stephen D. Meier
*Assistant Examiner*—Khanh Duong
(74) *Attorney, Agent, or Firm*—Moser, Patterson and Sheridan

(57) ABSTRACT

A method for forming a silicon oxide layer for use in integrated circuit fabrication is provided. The silicon oxide layer is formed by reacting a first gas mixture and a second gas mixture. The first gas mixture comprises tetra-ethyl-ortho-silicate (TEOS), helium (He) and nitrogen (N$_2$). The second gas mixture comprises ozone (O$_3$) and optionally, oxygen (O$_2$).

20 Claims, 4 Drawing Sheets

OTHER PUBLICATIONS

Iyer et al. "Electrical and Physical Characterization of Tetraethylorthosilicate–$O_3$ Borophosphosilicate Glass" J. Electrochem. Soc., vol. 143, No. 10, pp. 3366–3371, Oct. 1996.

Arno et al. "Fourier Transform Infrared Characterization of Downstream Gas–Phase Species Generated by Tetraethylorthosilicate/Ozone Atmospheric Pressure Reactions" J. Electrochem. Soc. 146(1) pp. 276–280, 1999.

Adachi et al. "Gas–Phase Nucleation in an Atmospheric Pressure Chemical Vapor Deposition Process for $SiO_2$ Films Using Tetraethylorthosilicate (TEOS)" Jpn. J. Appl. Phys., vol. 31, pp. L1439–L1442, 1992.

European Search Report No. EP 02 25 0829, dated Aug. 14, 2002.

* cited by examiner

METHOD OF FORMING A SILICON OXIDE LAYER ON A SUBSTRATE

BACKGROUND OF THE DISCLOSURE

1. Field of the Invention

The present invention relates to silicon oxide films, their use in integrated circuit fabrication, and a method for forming a silicon oxide film.

2. Description of the Background Art

Integrated circuits have evolved into complex devices that can include millions of components (e. g., transistors, capacitors and resistors) on a single chip. The evolution of chip designs continually requires faster circuitry and greater circuit density. The demands for greater circuit density necessitate a reduction in the dimensions of the integrated circuit components.

As the dimensions of the integrated circuit components are reduced (e. g., sub-micron dimensions), it has become increasingly common to employ trench isolation methods to electrically isolate adjoining active semiconductor regions of semiconductor substrates. For example, shallow trench isolation methods entail forming trench regions between active semiconductor regions. The trench regions are typically less than about 2–3 microns deep and are filled with a dielectric material.

Silicon oxide films have been suggested for use as the dielectric material for shallow trench isolation methods, since silicon oxides are good insulating materials. Silicon oxide films may be formed using chemical vapor deposition (CVD) processes. For example, silicon dioxide may be formed by reacting tetra-ethyl-ortho-silicate (TEOS) with ozone ($O_3$). Helium (He) or nitrogen ($N_2$) are typically used as the carrier gas for the TEOS.

Depending on which TEOS carrier gas is used, silicon dioxide films made therewith have different properties (e. g., wet etch rate ratios (WERR), deposition rates, shrinkage, trench gap fill). For example, when helium (He) is used as the carrier gas for TEOS, silicon dioxide films having low wet etch rate ratios and low deposition rates are formed. However, when nitrogen ($N_2$) is used as the TEOS carrier gas, silicon dioxide films having high wet etch rate ratios and low deposition rates are formed.

Thus, a need exists in the art for a method of forming silicon oxide films low wet etch rate ratios and high deposition rates.

SUMMARY OF THE INVENTION

A method for forming a silicon oxide layer for use in integrated circuit fabrication is provided. The silicon oxide layer is formed by reacting a first gas mixture and a second gas mixture. The first gas mixture comprises tetra-tehyl-ortho-silicate (TEOS), helium (He) and nitrogen ($N_2$). The second gas mixture comprises ozone ($O_3$) and optionally, oxygen ($O_2$). The helium (He) and nitrogen ($N_2$) in the first gas mixture preferably have a flow ratio of helium:nitrogen within a range of about 1:1 to about 1:3. Such flow ratios for the helium:nitrogen forms silicon oxide layers with increased deposition rates as well as improved wet etch rates without affecting the trench filling capabilities thereof.

The silicon oxide layer is compatible with integrated circuit fabrication processes. In one integrated circuit fabrication process, the silicon oxide layer is used as an insulating material for shallow trench isolation. For such an embodiment, a preferred process sequence includes providing a substrate having thereon, trench regions formed between active semiconductor regions. Thereafter, the trench regions are filled with a silicon oxide layer formed by reacting a first gas mixture comprising tetra-ethyl-orthosilicate (TEOS), helium (He) and nitrogen ($N_2$), with a second gas mixture comprising ozone ($O_3$) and, optionally, oxygen ($O_2$).

BRIEF DESCRIPTION OF THE DRAWINGS

The teachings of the present invention can be readily understood by considering the following detailed description in conjunction with the accompanying drawings, in which.

DETAILED DESCRIPTION

The invention is a method for forming a silicon oxide layer for use in integrated circuit fabrication. The silicon oxide layer is formed by reacting a first gas mixture and a second gas mixture, where the first gas mixture comprises tetra-ethyl-ortho-silicate (TEOS), helium (He) and nitrogen ($N_2$) and the second gas mixture comprises ozone ($O_3$) and optionally, oxygen ($O_2$). The use of a helium (He) and nitrogen ($N_2$) gas mixture as a carrier for the tetra-tehyl-ortho-silicate (TEOS) results in a silicon oxide layer that has improved characteristics over silicon oxide layers that are deposited in a conventional manner, i. e., a silicon oxide layer deposited by the inventive method has increased deposition rates and improved wet etch rate ratios.

Figure 1:
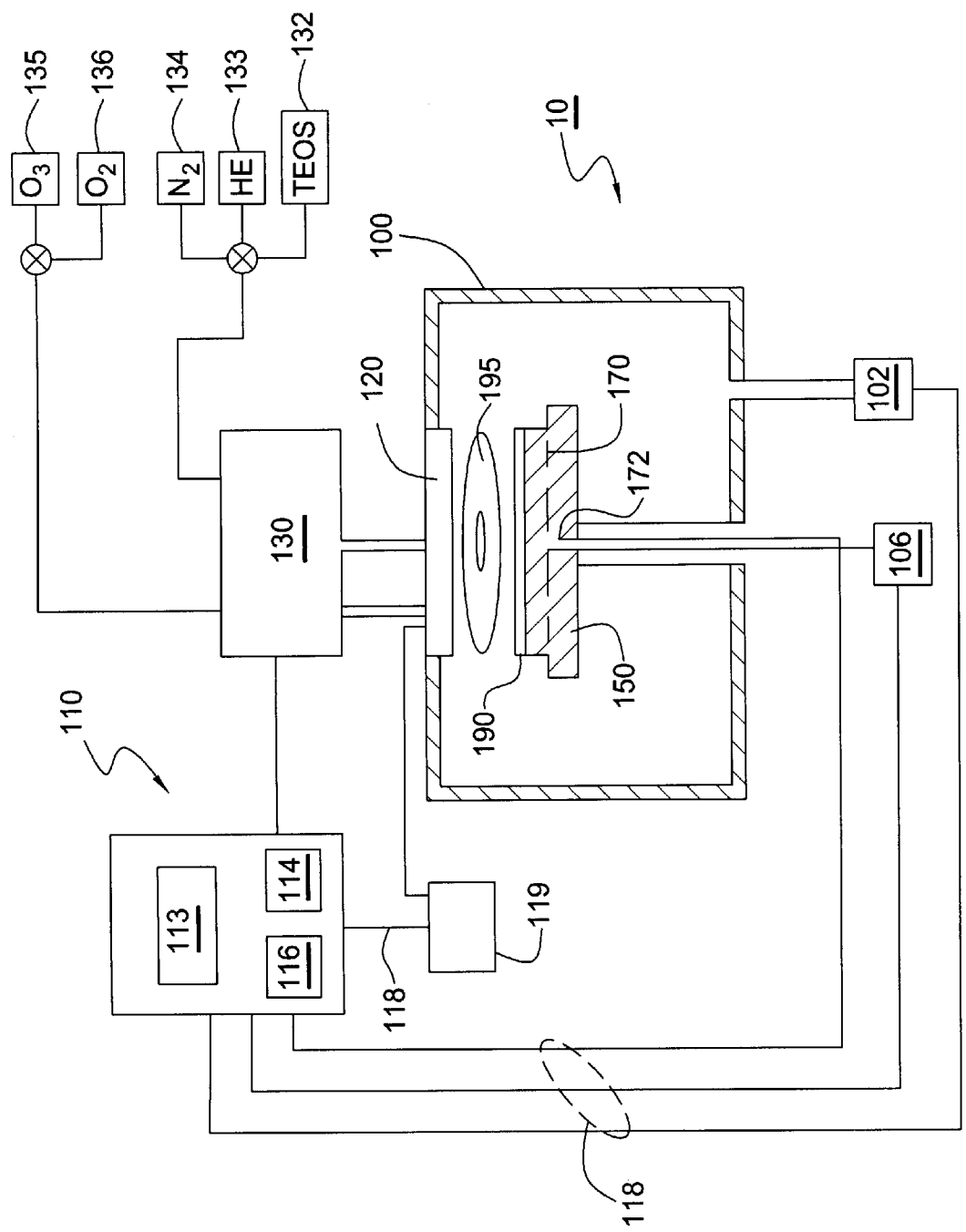
FIG. 1 depicts a schematic illustration of an apparatus that can be used for the practice of this invention.

FIG. 1 is a schematic representation of a wafer processing system 10 that can be used to perform silicon oxide layer formation in accordance with embodiments described herein. System 10 typically comprises a process chamber 100, a gas panel 130, a control unit 110, along with other hardware components such as power supplies and vacuum pumps. Details of the system 10 used in the present invention are described in commonly assigned U. S. patent application Ser. No. 09/211,998, entitled "High Temperature Chemical Vapor Deposition Chamber", filed on Dec. 14, 1998, and is herein incorporated by reference. The salient features of this system 10 are briefly described below. Examples of system 10 include subatmospheric chemical vapor deposition (SACVD) chambers such as PRODUCER™ chambers, and PRECISION 5000® chambers commercially available from Applied Materials Inc., Santa Clara, Calif.

The process chamber 100 generally houses a support pedestal 150, which is used to support a substrate such as a semiconductor wafer 190. This pedestal 150 can typically be moved in a vertical direction inside the chamber 100 using a displacement mechanism (not shown). Depending on the specific process, the wafer 190 can be heated to some desired temperature prior to layer deposition. For example, the wafer support pedestal 150 is heated by an embedded heater element 170. The pedestal 150 may be resistively heated by applying an electric current from an AC supply 106 to the heater element 170. The wafer 190 is, in turn, heated by the pedestal 150.

A temperature sensor 172, such as a thermocouple, is also embedded in the wafer support pedestal 150 to monitor the temperature of the pedestal 150 in a conventional manner. The measured temperature is used in a feedback loop to control the power supply 16 for the heating element 170, such that the wafer temperature can be maintained or controlled at a desired temperature which is suitable for the particular process application. The pedestal 150 is optionally heated using radiant heat (not shown).

A vacuum pump 102, is used to evacuate the process chamber 100 and to maintain the proper gas flows and pressure inside the chamber 100. A showerhead 120, through which process gases are introduced into the chamber 100, is located above the wafer support pedestal 150. The showerhead 120 is connected to a gas panel 130, which controls and supplies various gases used in different steps of the process sequence.

Proper control and regulation of the gas flows through the gas panel 130 is performed by mass flow controllers (not shown) and a controller unit 110 such as a computer. For example, the gas panel 130 comprises a tetra-ethyl-orthosilicate (TEOS) source 132, a helium (He) source 133, a nitrogen ($N_2$) source 134, and an ozone ($O_3$) source 135. An optional oxygen ($O_2$) source 136 may also be used. The showerhead 120 allows process gases from the gas panel 130 to be uniformly introduced and distributed in the process chamber 100.

Illustratively, the control unit 110 comprises a central processing unit (CPU) 112, support circuitry 114, and memories containing associated control software 116. This control unit 110 is responsible for automated control of the numerous steps required for wafer processing—such as wafer transport, gas flow control, temperature control, chamber evacuation, and other steps. Bi-directional communications between the control unit 110 and the various components of the apparatus 10 are handled through numerous signal cables collectively referred to as signal buses 118, some of which are illustrated in FIG. 1.

The heated pedestal 150 is typically made of aluminum, and comprises a heating element 170 embedded at a distance below the wafer support surface 151 of the pedestal 150. The heating element 170 can be made of a nickel-chromium wire encapsulated in an Incaloy sheath tube. By properly adjusting the current supplied to the heating element 170, the wafer 190 and the pedestal 150 can be maintained at a relatively constant temperature during film deposition. This is accomplished by a feedback control loop, in which the temperature of the pedestal 150 is continuously monitored by a thermocouple 172 embedded in the pedestal 150. This information is transmitted to the control unit 110, via a signal bus 118, which responds by sending the necessary signals to the heater power supply. Adjustment is subsequently made in the current supply 106 to maintain and control pedestal 150 at a desirable temperature (i.e., a temperature that is appropriate for the specific process application). When the process gas mixture exits the showerhead 120, the process gases react at the surface 191 of the heated wafer 190, resulting in the deposition of a silicon dioxide layer on the wafer 190.

Silicon Oxide Layer Deposition

In general, the following deposition process parameters can be used to form the silicon oxide layer using a SACVD chamber similar to the on depicted in FIG. 1. The process parameters range from a wafer temperature of about 150° C. to about 850° C., a chamber pressure of about 1 torr to about 600 torr, a TEOS flow rate of about 500 mgm (milligrams/minute) to about 1500 mgm, a helium flow rate of about 1000 sccm to about 3000 sccm, a nitrogen flow rate of about 1000 scorn to about 9000 sccm, and an ozone concentration in oxygen of about 12.5 weight % with an ozone/oxygen flow rate of about 1000 sccm to about 6000 sccm. The helium (He) and nitrogen ($N_2$) are preferably provided to the deposition chamber at a flow ratio of helium:nitrogen within a range of about 1:1 to about 1:3.

Other deposition chambers are within the scope of the invention, and the parameters listed above may vary according to the particular deposition chamber used to form the silicon oxide layer. For example, other deposition chambers may have a larger or smaller volume, requiring gas flow rates that are larger or smaller than those recited for deposition chambers available from Applied Materials, Inc. and may be configured to accommodate 300 mm substrates.

Figure 2A:
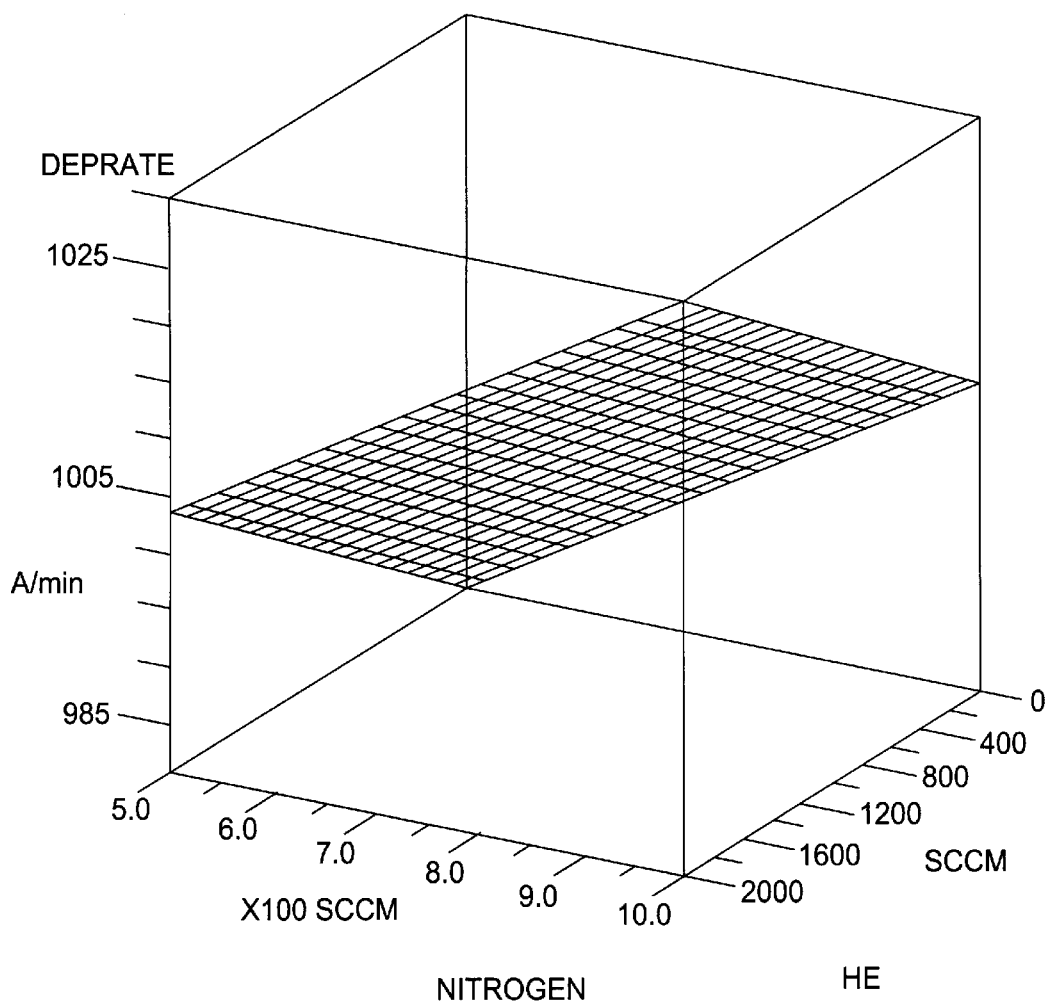
FIG. 2a illustrates a three dimensional graph of the silicon oxide deposition rate plotted as a function of both the nitrogen flow rate and the helium flow rate.

Referring to FIG. 2a, a three dimensional graph of the silicon oxide deposition rate is plotted as a function of both the nitrogen flow rate and the helium flow rate for a TEOS flow rate of 1100 sccm. As shown in FIG. 2a, using a mixed helium nitrogen carrier for the TEOS increases the deposition rate for the silicon oxide as compared to using either helium or nitrogen separately for the carrier gas.

Figure 2B:
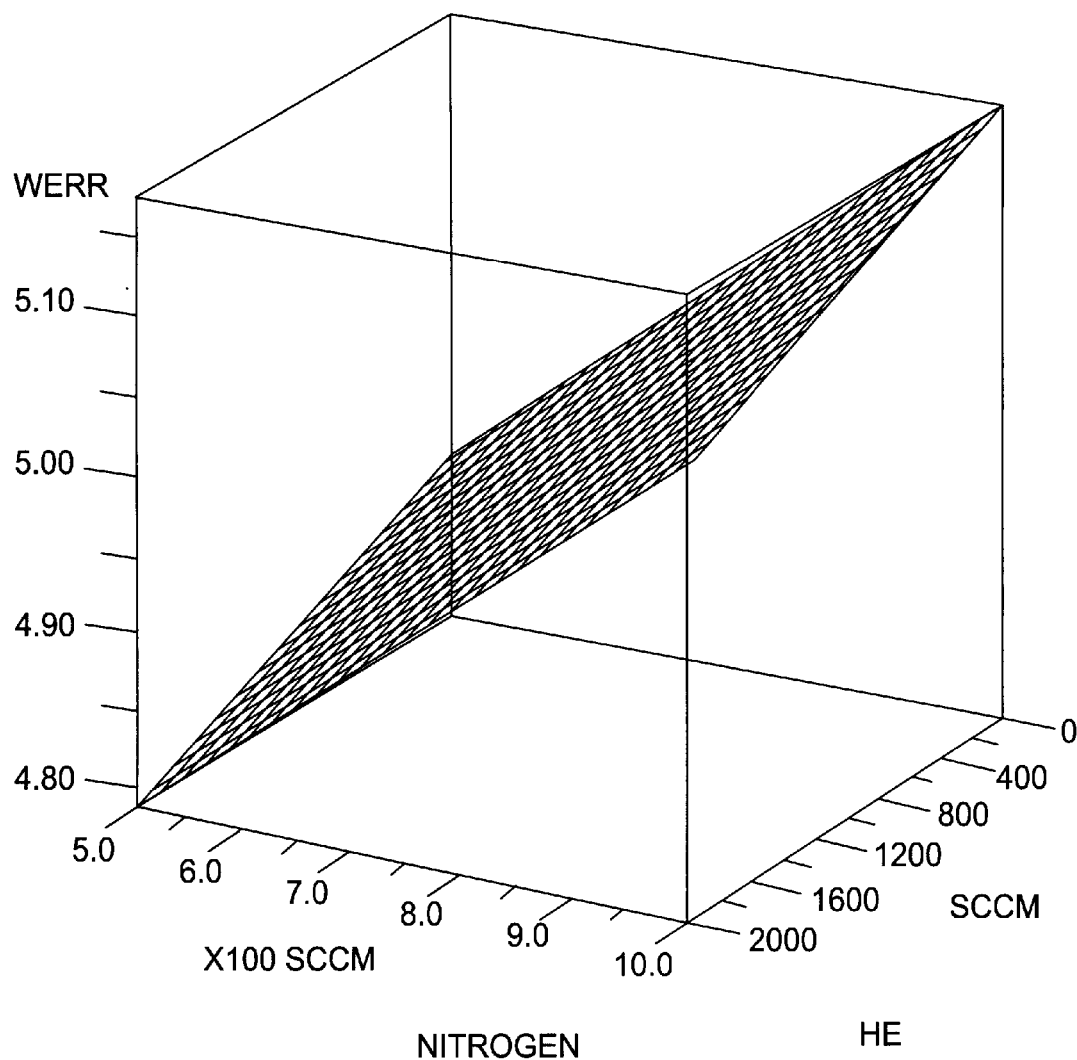
FIG. 2b illustrates a three dimensional graph of the silicon oxide wet etch rate ratio (WERR) plotted as a function of both the nitrogen flow rate and the helium flow rate.

Referring to FIG. 2b, a three dimensional graph of the silicon oxide wet etch rate ratio (WERR) (as referred to the thermal silicon oxide) is plotted as a function of both the nitrogen flow rate and the helium flow rate for a TEOS flow rate of 1100 sccm. As shown in FIG. 2b, increasing the helium flow and decreasing the nitrogen flow decreases the wet etch rate ratio of the as-deposited silicon oxide layer using a mixed helium nitrogen carrier for the TEOS, as compared to using either helium or nitrogen separately for the carrier gas. Decreasing the wet etch rate ratio for the as-deposited silicon oxide layer is believed to be an indication of better oxide quality (e. g., higher density films).

Oxide Trench Isolation Material

Figure 3A:
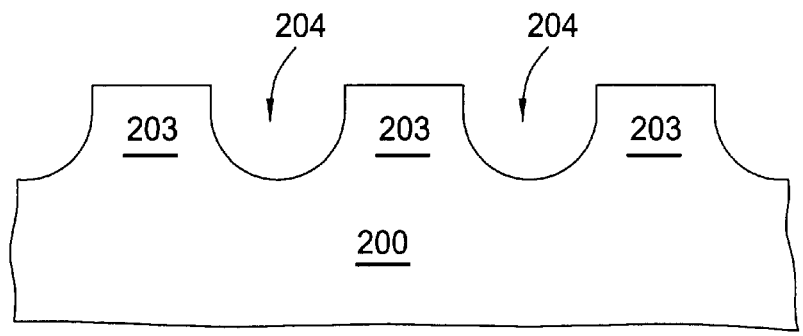
FIGS. 3a–3c depict schematic cross-sectional views of a substrate at different stages of integrated circuit fabrication incorporating a silicon oxide layer as an insulating material for shallow trench isolation.
Figure 3B:
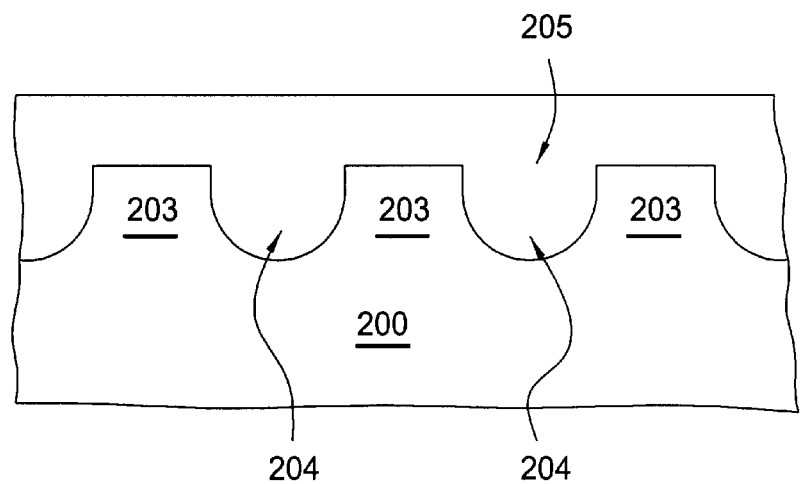
Figure 3C:
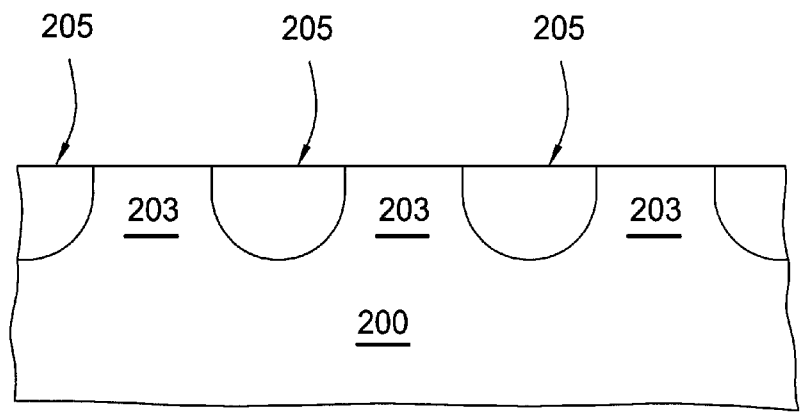

FIGS. 3a–3c illustrate schematic cross-sectional views of a substrate 200 at different stages of an integrated circuit fabrication sequence incorporating a silicon oxide layer as a trench isolation material. In general, the substrate 200 refers to any workpiece on which processing is performed, and a substrate structure 250 is used to generally denote the substrate together with other material layers formed on the substrate 200. Depending on the specific stage of processing, the substrate 200 may correspond to a silicon substrate, or other material layer that has been formed on the substrate.

FIG. 3a, for example, illustrates a cross-sectional view of a trench structure 250. The trench structure includes active semiconductor regions 203 and trench regions 204. The trench regions 204 may have depth of about 2–3 microns for shallow trench devices and about 5–10 microns for deep trench devices.

FIG. 3b depicts a silicon oxide layer 205 formed on the trench structure 250 of FIG. 3a. The silicon oxide layer 205 fills the trench regions 204 of the trench structure 250. The silicon oxide layer 204 is formed on the substrate structure 250 according to the process parameters described above. The thickness of the silicon oxide layer is variable depending on the depth of the trench region 204 to be filled. Thereafter, referring to FIG. 3c, portions of the silicon oxide layer 205 formed over the active semiconductor regions 203 may be removed using for example, a chemical mechanical polishing (CMP) process.

Although several preferred embodiments which incorporate the teachings of the present invention have been shown and described in detail, those skilled in the art can readily devise many other varied embodiments that still incorporate these teachings.

What is claimed is:

1. A method of forming a silicon oxide layer on a substrate, comprising:

positioning a substrate in a deposition chamber;

providing a first gas mixture and a second gas mixture to the deposition chamber, wherein the first gas mixture comprises tetra-ethyl-ortho-silicate, helium and nitrogen, and wherein the second gas mixture comprises ozone; and reacting the first gas mixture and the second gas mixture in the deposition chamber to form a silicon oxide layer on the substrate.

2. The method of claim 1 wherein the helium and nitrogen in the first gas mixture are provided to the deposition chamber at a flow ratio of helium: nitrogen within a range of about 1:1 to about 1:3.

3. The method of claim 1 wherein the second gas mixture further comprises oxygen.

4. The method of claim 1 wherein the deposition chamber is maintained at a temperature within a range of about 150° C. to about 850° C.

5. The method of claim 1 wherein the deposition chamber is maintained at a pressure within a range of about 1 torr to about 600 torr.

6. The method of claim 3 wherein the ozone concentration in the second gas mixture is about 12.5 weight %.

7. A method of fabricating a device, comprising:

forming a silicon oxide layer on a substrate, wherein the silicon oxide layer is formed by reacting a first gas mixture comprising tetra-ethyl-ortho-silicate, helium and nitrogen with a second gas mixture comprising ozone in a deposition chamber.

8. The method of claim 7 wherein the helium and nitrogen in the first gas mixture are provided to the deposition chamber at a flow ratio of helium: nitrogen within a range of about 1:1 to about 1:3.

9. The method of claim 7 wherein the second gas mixture further comprises oxygen.

10. The method of claim 7 wherein the deposition chamber is maintained at a temperature within a range of about 150° C. to about 850° C.

11. The method of claim 7 wherein the deposition chamber is maintained at a pressure within a range of about 1 torr to about 600 torr.

12. The method of claim 9 wherein the ozone concentration in the second gas mixture is about 12.5 weight %.

13. A method of forming a silicon oxide layer on a substrate, comprising:

positioning a substrate in a deposition chamber;

providing a first gas mixture and a second gas mixture to the deposition chamber, wherein the first gas mixture comprises tetra-ethyl-ortho-silicate, helium and nitrogen, wherein the second gas mixture comprises ozone, and wherein the helium and nitrogen in the first gas mixture are provided to the deposition chamber at a flow ratio of helium : nitrogen within a range of about 1:1 to about 1:3; and reacting the first gas mixture and the second gas mixture in the deposition chamber to form a silicon oxide layer on the substrate.

14. A method of forming a silicon oxide layer on a substrate, comprising:

positioning a substrate in a deposition chamber;

providing a first gas mixture and a second gas mixture to the deposition chamber, wherein the first gas mixture comprises tetra-ethyl-ortho-silicate, helium and nitrogen, wherein the second gas mixture comprises ozone; and wherein the helium and nitrogen in the first gas mixture are provided to the deposition chamber at a flow ratio of helium : nitrogen within a range of about 1:1 to about 1:3;

wherein the tetra-ethyl-ortho-silicate is provided to the deposition chamber at a flow rate of about 500 mgm (milligrams/minute) to about 1500 mgm, the helium is provided to the deposition chamber at a flow rate of about 1000 sccm to about 3000 sccm, and the nitrogen is provided to the deposition chamber at a flow rate of about 1000 sccm to about 3000 sccm; and reacting the first gas mixture and the second gas mixture in the deposition chamber to form a silicon oxide layer on the substrate.

15. The method of claim 1, wherein the silicon oxide layer is removed to reveal a semiconductor region.

16. The method of claim 1, wherein providing a first gas mixture comprising tetra-ethyl-ortho-silicate, helium, and nitrogen at a tetra-ethyl-ortho-silicate flow of about 1100 sccm provides a silicon oxide layer deposition rate of about 985 angstroms/minute.

17. The method of claim 13, wherein the second gas mixture further comprises oxygen.

18. The method of claim 13, wherein the deposition chamber is maintained at a pressure of from about 1 torr to about 600 torr.

19. The method of claim 13, wherein the ozone concentration in the second gas mixture is about 12.5 weight %.

20. The method of claim 13, wherein the deposition chamber is maintained at a temperature of from about 150° C. to about 850° C.

* * * * *

UNITED STATES PATENT AND TRADEMARK OFFICE
CERTIFICATE OF CORRECTION

PATENT NO.   : 6,511,924 B2
DATED        : January 28, 2003
INVENTOR(S)  : Mukai et al.

It is certified that error appears in the above-identified patent and that said Letters Patent is hereby corrected as shown below:

Column 1,
Line 54, please change "tehyl" to -- ethyl --.

Column 2,
Line 19, please change "rate." to -- rate; --
Line 37, please change "tehyl" to -- ethyl --.

Column 4,
Line 1, please change "on" to -- one --.
Line 2, please change "150º C." to -- 150ºC --.
Line 7, please change "1000 scorn" to -- 1000 sccm --.
Line 40, please insert "Silicon" before -- Oxide --.

Column 5,
Lines 26 and 47, please change "150º C." to -- 150ºC --.

Column 6,
Line 51, please change "150º C." to -- 150ºC --.

Signed and Sealed this

Twenty-fourth Day of June, 2003

JAMES E. ROGAN
*Director of the United States Patent and Trademark Office*